(12) United States Patent
Huang et al.

(10) Patent No.: US 10,983,256 B2
(45) Date of Patent: Apr. 20, 2021

(54) PRIVACY FILMS FOR CURVED DISPLAYS

(71) Applicant: Apple Inc., Cupertino, CA (US)

(72) Inventors: Yi Huang, San Jose, CA (US); Steven M. Scardato, Sunnyvale, CA (US); ByoungSuk Kim, Palo Alto, CA (US); Jun Qi, San Jose, CA (US); Victor H Yin, Cupertino, CA (US); Wenyong Zhu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 56 days.

(21) Appl. No.: 16/421,838

(22) Filed: May 24, 2019

(65) Prior Publication Data
US 2020/0049864 A1 Feb. 13, 2020

Related U.S. Application Data

(60) Provisional application No. 62/717,509, filed on Aug. 10, 2018.

(51) Int. Cl.
*B32B 3/00* (2006.01)
*G02B 5/00* (2006.01)
(Continued)

(52) U.S. Cl.
CPC .............. *G02B 5/003* (2013.01); *B32B 27/08* (2013.01); *B32B 27/36* (2013.01); *G02F 1/133512* (2013.01); *H01L 51/5275* (2013.01); *H01L 51/5284* (2013.01); *B32B 2255/10* (2013.01); *B32B 2307/41* (2013.01); *B32B 2307/412* (2013.01); *B32B 2457/20* (2013.01); *G02B 5/04* (2013.01); *G02B 6/0005* (2013.01);
(Continued)

(58) Field of Classification Search
CPC .............. G02B 5/003; G02F 1/133512; H01L 51/5284
See application file for complete search history.

(56) References Cited

U.S. PATENT DOCUMENTS 8,068,278 B2 11/2011 Janson et al.
9,126,396 B2 9/2015 Degani et al.
(Continued)

FOREIGN PATENT DOCUMENTS

WO 2009085581 A1 7/2009

*Primary Examiner* — Elizabeth E Mulvaney
(74) *Attorney, Agent, or Firm* — Treyz Law Group, P.C.; Joseph F. Guihan

(57) ABSTRACT

A privacy film may have a light-blocking layer that is interposed between first and second transparent substrates. The light-blocking layer may have a plurality of opaque portions and a plurality of transparent portions. The opaque portions may be shaped to ensure light from the display is directed only to the primary viewer of the display. Each opaque portion of the light-blocking layer may extend along a respective longitudinal axis between the first and second transparent substrates. Privacy films used to cover curved displays may have opaque portions that extend along longitudinal axes that have different angles relative to the transparent substrates. Opaque portions in the edge of the privacy film may have longitudinal axes that are at non-perpendicular angles with respect to the transparent substrates. A privacy film for a curved display may also include a light-redirecting layer such as a prism layer or a liquid crystal layer.

21 Claims, 13 Drawing Sheets

(51) Int. Cl.
  H01L 51/52      (2006.01)
  G02F 1/1335     (2006.01)
  B32B 27/08      (2006.01)
  B32B 27/36      (2006.01)
  H01L 27/32      (2006.01)
  F21V 8/00       (2006.01)
  G02B 5/04       (2006.01)
  G02F 1/1333     (2006.01)

(52) U.S. Cl.
  CPC .... *G02F 1/13338* (2013.01); *G02F 1/133524* (2013.01); *G02F 2001/133562* (2013.01); *H01L 27/323* (2013.01); *H01L 27/3232* (2013.01)

(56) References Cited

U.S. PATENT DOCUMENTS

| | | |
|---|---|---|
| 2008/0186558 A1 | 8/2008 | Lee et al. |
| 2013/0300985 A1 | 11/2013 | Bulda |
| 2017/0310956 A1 | 10/2017 | Perdices-Gonzalez et al. |
| 2018/0156955 A1 | 6/2018 | Diao et al. |
| 2018/0173019 A1* | 6/2018 | Huang .................. G02B 5/045 |
| 2018/0365452 A1 | 12/2018 | Li |
| 2019/0050621 A1 | 2/2019 | Xu et al. |
| 2019/0271877 A1* | 9/2019 | Harrison ............. H01L 51/5262 |

\* cited by examiner

PRIVACY FILMS FOR CURVED DISPLAYS

This application claims the benefit of provisional patent application No. 62/717,509, filed Aug. 10, 2018, which is hereby incorporated by reference herein in its entirety.

FIELD

This relates generally to electronic devices and, more particularly, to electronic devices with displays.

BACKGROUND

Electronic devices often include displays. For example, laptop computers have displays. Displays are typically designed to display images over a relatively wide angle of view to accommodate movements in the position of a viewer relative to the display. In some situations, such as when a user of a laptop or other device with a display is using the device in public, the wide viewing angle is undesirable as it compromises privacy.

SUMMARY

In some situations, privacy may be a concern for a user of an electronic device with a display. The user may, for example, wish to limit the viewing angle of the display to prevent neighboring people from viewing the display. In certain user scenarios, reducing the viewing angle may also offer a better user experience. A privacy film may be used to reduce the viewing angle of a display. A privacy film may be a removable privacy film that is selectively placed over a display in an electronic device or a privacy film may be integrated within a display in an electronic device.

The privacy film may have a light-blocking layer that is interposed between first and second transparent substrates. The light-blocking layer may have a plurality of opaque portions and a plurality of transparent portions. The opaque portions may be shaped to ensure light from the display is directed only to the primary viewer of the display.

Each opaque portion of the light-blocking layer may extend along a respective longitudinal axis between the first transparent substrate and the second transparent substrate. Privacy films used to cover planar displays may have opaque portions that all extend along parallel longitudinal axes. Privacy films used to cover curved displays, however, may have opaque portions that extend along longitudinal axes that have different angles relative to the transparent substrates. Opaque portions in the center of the privacy film may have longitudinal axes that are substantially perpendicular to the transparent substrates. Opaque portions in the edge of the privacy film, however, may have longitudinal axes that are at non-perpendicular angles with respect to the transparent substrates. This arrangement may allow for a viewer of a curved display covered by the privacy film to view both the center and edges of the curved display.

A privacy film for a curved display may also include a light-redirecting layer. The light-redirecting layer may redirect light towards the primary viewer of the display. In the edge of the display, light may be redirected by a larger angle than in the center of the display. The light-redirecting layer may be a prism layer or a liquid crystal layer. A coherent fiber bundle may also be used in a privacy film to redirect light to a primary viewer of a curved display.

DETAILED DESCRIPTION

Figure 1:
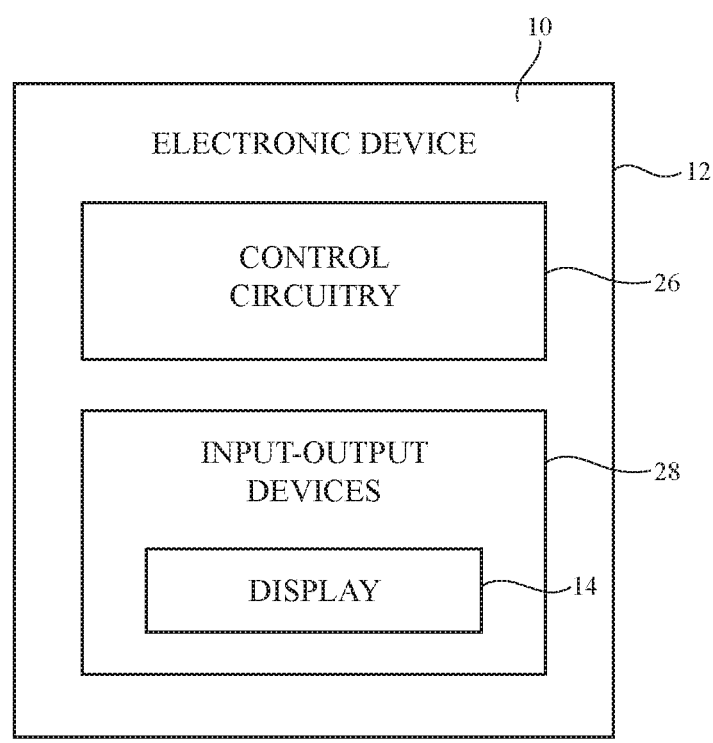
FIG. 1 is a schematic diagram of an illustrative electronic device having a display in accordance with an embodiment.

A schematic diagram or an illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, device 10 includes a display such as display 14. Display 14 may be mounted in housing 12. The housing may sometimes be referred to as an enclosure or case, may be formed of plastic, glass, ceramics, fiber composites, metal (e.g., stainless steel, aluminum, etc.), other suitable materials, or a combination of any two or more of these materials. The housing may be formed using a unibody configuration in which some or all of the housing is machined or molded as a single structure or may be formed using multiple structures (e.g., an internal frame structure, one or more structures that form exterior housing surfaces, etc.). In one illustrative embodiment, the housing may include an upper housing and a lower housing that are connected to each other using hinge structures located along the upper edge of the lower housing and the lower edge of the upper housing. Hinges may allow the upper housing to rotate about a longitudinal axis relative to the lower housing. The display may be mounted in the upper housing if desired.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of electrowetting pixels, an array of organic light-emitting diode pixels, or pixels based on other display technologies. Configurations in which display 14 is a liquid crystal display with a backlight are sometimes described herein as an example. This use of liquid crystal display technology for forming display 14 is merely illustrative. Display 14 may, in general, be formed using any suitable type of pixels (e.g., display 14 may be an organic light-emitting diode display).

As shown in FIG. 1, device 10 may have input-output devices 28. Input-output devices may include a track pad or a keyboard, for example. Device 10 may also have components such as cameras, microphones, speakers, buttons, status indicator lights, buzzers, sensors, and other input-output devices. These devices may be used to gather input for device 10 and may be used to supply a user of device 10 with output. Connector ports in device 10 may receive mating connectors (e.g., an audio plug, a connector associated with a data cable such as a Universal Serial Bus cable, a data cable that handles video and audio data such as a cable that connects device 10 to a computer display, television, or other monitor, etc.).

As shown in FIG. 1, electronic device 10 may have control circuitry 26. Control circuitry 26 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 26 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 28 may be used to allow data to be supplied to device 10 and to allow data to be provided from device 10 to external devices. Input-output devices 28 may include buttons, joysticks, scrolling wheels, touch pads, key pads, keyboards, microphones, speakers, tone generators, vibrators, cameras, sensors (e.g., ambient light sensors, proximity sensors, orientation sensors, magnetic sensors, force sensors, touch sensors, etc.), light-emitting diodes and other status indicators, data ports, etc. A user can control the operation of device 10 by supplying commands through input-output devices 28 and may receive status information and other output from device 10 using the output resources of input-output devices 28. Input-output devices 18 may include one or more displays such as display 14.

Control circuitry 26 may be used to run software on device 10 such as operating system code and applications. During operation of device 10, the software running on control circuitry 26 may display images on display 14 using an array of pixels in display 14. While displaying images, control circuitry 26 may control the transmission of each of the pixels in the array and can make adjustments to the amount of backlight illumination for the array that is being produced by backlight structures in display 14.

Control circuitry 26 may direct display 14 to operate in different operating modes. For example, control circuitry 26 can direct display 14 to operate in a normal operating mode when privacy is not a concern. In the normal operating mode, the images on display 14 may be visible to people seated next to the user of device 10 due to the relatively wide angle of view of display 14 in normal operation. In situations in which privacy is a concern, a user may supply input to control circuitry 26 to place display 14 in a privacy mode in which the angle of view of display 14 is restricted. In response, control circuitry 26 may make adjustments to display 14 (e.g., backlight adjustments and/or adjustments to angle-of-view restriction structures elsewhere in display 14) that reduce the angle of view of display 14. When the angle of view of display 14 is lowered, it will become difficult or impossible for viewers that are located at off-axis positions relative to display 14 to view images on display 14 (e.g., a viewer seated next to the user on an airplane will not be able to view images on display 14). At the same time, the user of device 10 who is seated in an on-axis position will be able to use display 14 to view images.

Changes in the operating mode of display 14 to implement angle-of-view restrictions (i.e., adjustments to display 14 to place display 14 in normal viewing mode or a reduced-angle-of-view privacy mode) may be made based on user input or may be made automatically by control circuitry 26. Control circuitry 26 may, for example, use information such as content sensitivity information to determine whether or not content that is being display on display 14 should be displayed in normal mode or privacy mode. If, for example, a user is viewing a movie, the movie may be displayed in normal mode. In the event that a private message such as an incoming text message is detected, display 14 may be placed in privacy mode, thereby ensuring that the content of the text message will not be inadvertently revealed to unauthorized parties. If desired, only a part of display 14 may be placed in privacy mode (e.g., to ensure the privacy of a text message) while the remainder of display 14 is operated normally (e.g. to display a movie).

Figure 2:
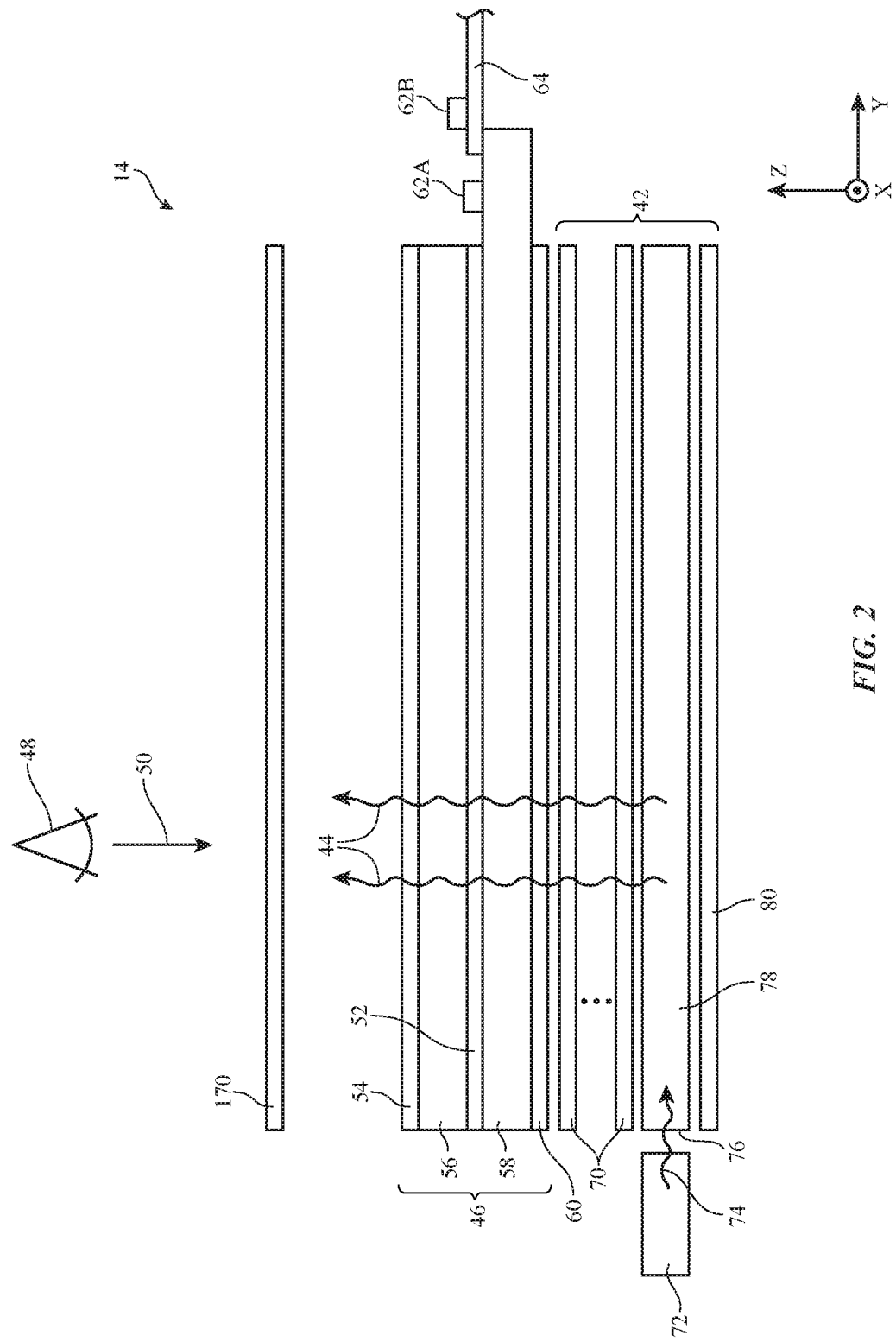
FIG. 2 is a cross-sectional side view of an illustrative liquid crystal display that may be covered by a privacy film in accordance with an embodiment.

A cross-sectional side view of an illustrative configuration for display 14 of device 10 (e.g., for display 14 of the device of FIG. 1 or other suitable electronic device) is shown in FIG. 2. As shown in FIG. 2, display 14 may include backlight structures such as backlight unit 42 for producing backlight 44. During operation, backlight 44 travels outwards (vertically upwards in dimension Z in the orientation of FIG. 2) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78 (sometimes referred to herein as a light guide layer). Light guide layer 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide layer 78 and may be distributed in dimensions X and Y throughout light guide layer 78 due to the principal of total internal reflection. Light guide layer 78 may include light-scattering features such as pits or bumps. The light-scattering features may be located on an upper surface and/or on an opposing lower surface of light guide plate 78.

Light 74 that scatters upwards in direction Z from light guide layer 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide layer 78 and reflector 80. For example, if light guide plate 78 has a rectangular footprint in the X-Y plane of FIG. 2, optical films 70 and reflector 80 may have a matching rectangular footprint.

Lower polarizer layer 60 and upper polarizer layer 54 may be linear polarizers with optical axes that are offset by 90°. The linear polarizers may (in combination with liquid crystal layer 52) allow per-pixel control of the magnitude of emitted light. After the light passes through upper polarizer 54, the light may be linearly polarized. If desired, display 14 may have a protective outer display layer such as cover layer 170. The outer display layer may be formed from a material such as sapphire, glass, plastic, clear ceramic, or other transparent material.

Figure 3:
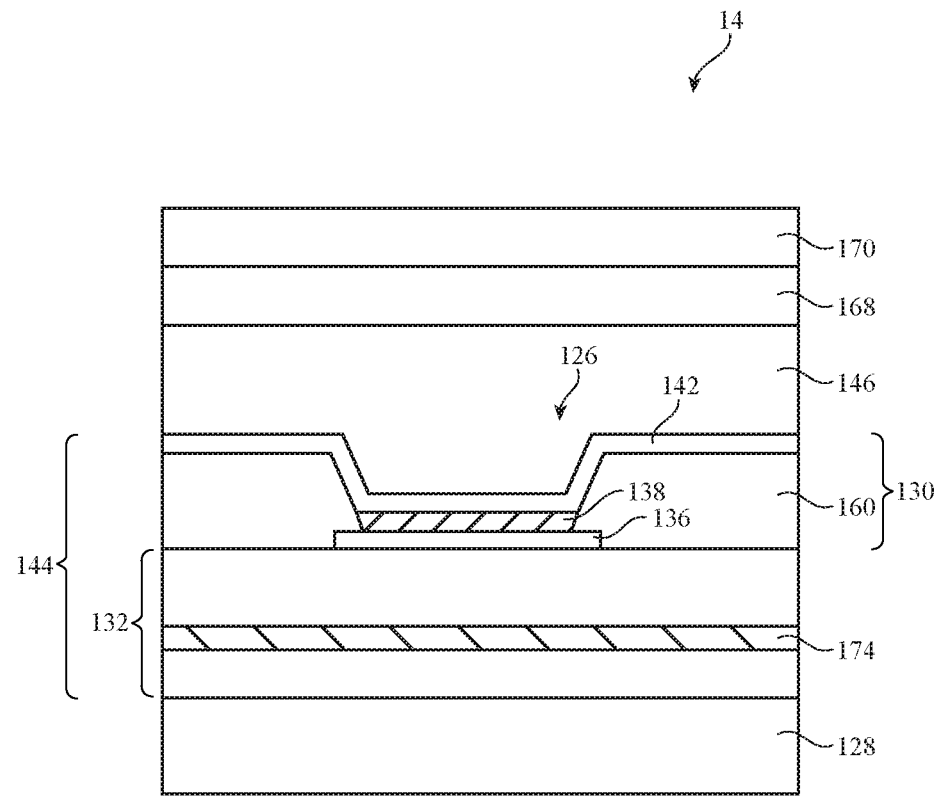
FIG. 3 is a cross-sectional side view of an illustrative organic light-emitting diode display that may be covered by a privacy film in accordance with an embodiment.

The example in FIG. 2 of display 14 being a liquid crystal display with backlight structures is merely illustrative. If desired, display 14 may instead be another type of display such as an organic light-emitting diode display. A cross-sectional side view of a portion of an illustrative organic light-emitting diode display is shown in FIG. 3. As shown in FIG. 3, display 14 may include a substrate layer such as substrate layer 128. Substrate 128 may be formed from a polymer or other suitable materials.

Thin-film transistor circuitry 144 (sometimes referred to as display layers 144) may be formed on substrate 128. Thin film transistor circuitry 144 may include layers 132. Layers 132 may include inorganic layers such as inorganic buffer layers, barrier layers (e.g., barrier layers to block moisture and impurities), gate insulator, passivation, interlayer dielectric, and other inorganic dielectric layers. Layers 132 may also include organic dielectric layers such as a polymer planarization layer. Metal layers and semiconductor layers may also be included within layers 132. For example, semiconductors such as silicon, semiconducting-oxide semiconductors, or other semiconductor materials may be used in forming semiconductor channel regions for thin-film transistors. Metal in layers 132 such as metal traces 174 may be used in forming transistor gate terminals, transistor source-drain terminals, capacitor electrodes, and metal interconnects.

As shown in FIG. 3, display layers 144 may include diode anode structures such as anode 136. Anode 136 may be formed from a layer of conductive material such as metal on the surface of layers 132 (e.g., on the surface of a planarization layer that covers underlying thin-film transistor structures). Light-emitting diode 126 may be formed within an opening in pixel definition layer 160. Pixel definition layer 160 may be formed from a patterned photoimageable polymer such as polyimide and/or may be formed from one or more inorganic layers such as silicon nitride, silicon dioxide, or other suitable materials.

In each light-emitting diode, layers of organic material 138 may be interposed between a respective anode 136 and cathode 142. Anodes 136 may be patterned from a layer of metal (e.g., silver) and/or one or more other conductive layers such as a layer of indium tin oxide or other transparent conductive material. Cathode 142 may be formed from a common conductive layer that is deposited on top of pixel definition layer 160. Cathode 142 may be formed from a thin metal layer (e.g., a layer of metal such as a magnesium silver layer) and/or indium tin oxide or other transparent conductive material. Cathode 142 is preferably sufficiently transparent to allow light to exit light emitting diode 126.

If desired, the anode of diode 126 may be formed from a blanket conductive layer and the cathode of diode 126 may be formed from a patterned conductive layer. The illustrative configuration of display 14 in which a transparent blanket cathode layer 142 covers diodes that have individually patterned anodes 136 allows light to be emitted from the top of display 14 (i.e., display 14 in the example of FIG. 3 is a "top emission" organic light-emitting diode display). Display 14 may be implemented using a bottom emission configuration if desired. Layers such as layers 136, 138, and 142 are used in forming organic light-emitting diodes such as diode 126 of FIG. 3, so this portion of display 14 is sometimes referred to as an organic light-emitting diode layer (see, e.g., layer 130 of FIG. 3).

If desired, display 14 may have a protective outer display layer such as cover layer 170. As discussed in connection with FIG. 2, the outer display layer may be formed from a material such as sapphire, glass, plastic, clear ceramic, or other transparent material. Protective layer 146 may cover cathode 142. Layer 146, which may sometimes be referred to as an encapsulation layer may include moisture barrier structures, encapsulant materials such as polymers, adhesive, and/or other materials to help protect thin-film transistor circuitry.

Functional layers 168 may be interposed between layer 146 and cover layer 170. Functional layers 168 may include a touch sensor layer, a circular polarizer layer, a sunglass-friendly optical film, a privacy film, and other layers. A circular polarizer layer may help reduce light reflections from reflective structures such as anodes 136. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 170 and functional layers 168 to underlying display layers such as layer 146, thin-film transistor circuitry 144, and substrate 128.

Organic layer 138 may include an organic emissive layer (e.g., a red emissive layer in red diodes that emits red light, a green emissive layer in green diodes that emits green light, and a blue emissive layer in blue diodes that emits blue light, etc.). The emissive material may be a material such as a phosphorescent material or fluorescent material that emits light during diode operation. The emissive material in layer 138 may be sandwiched between additional diode layers such as hole injection layers, hole transport layers, electron injection layers, and electron transport layers.

Figure 4:
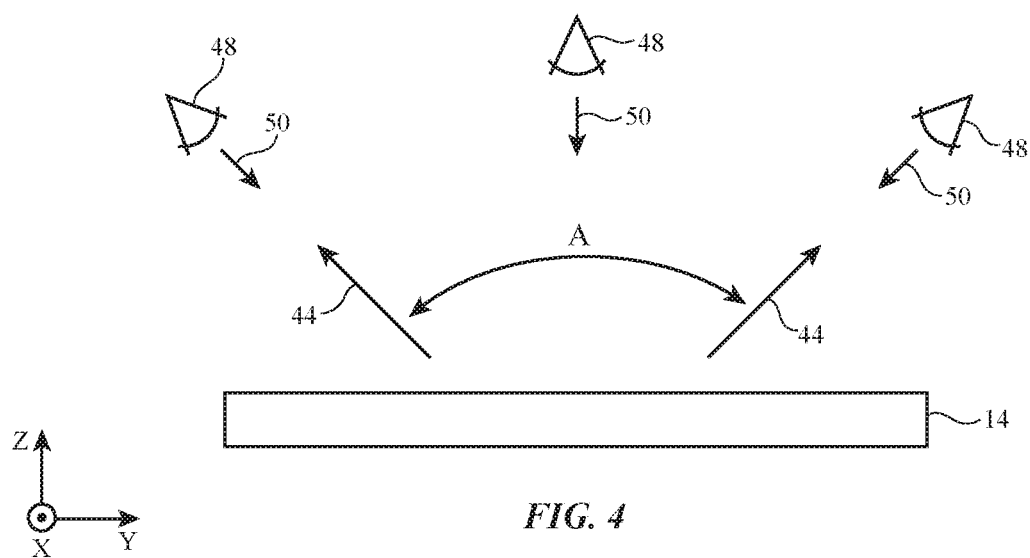
FIG. 4 is a cross-sectional side view of an illustrative display being used in a wide viewing angle mode in accordance with an embodiment.
Figure 5:
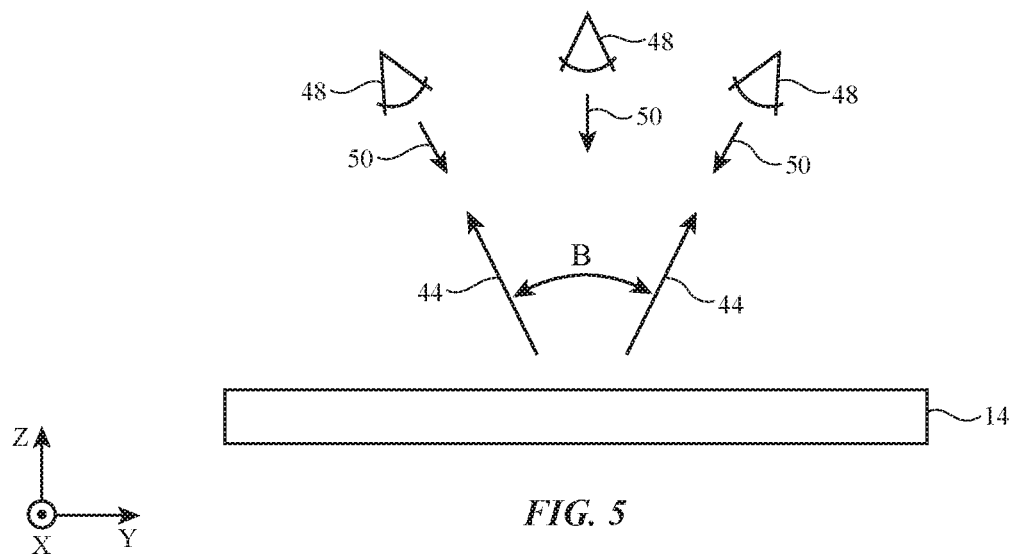
FIG. 5 is a cross-sectional side view of an illustrative display of the type shown in FIG. 4 being used in a reduced-viewing-angle mode in accordance with an embodiment.

It may be desirable to allow display 14 to be operated in multiple viewing modes such as a normal angle-of-view mode and a reduced angle-of-view mode (e.g., a privacy mode). When operated in the normal angle-of-view mode, viewer 48 can view images on display 14 over a relatively wide range of angles (see, e.g., display 14 of FIG. 4, which is displaying images over wide angle of view A). The normal angle-of-view mode may be used when privacy is not a concern. When privacy is desired, display 14 can be operated in the reduced angle-of-view mode. In this mode, viewer 48 can view images on display 14 over a more restricted range of angles (see, e.g., display 14 of FIG. 5, which is displaying images over reduced angle of view B, where B<A). By restricting the angle-of-view, the images of display 14 may not be visible to people seated next to the user of device 10, offering increased privacy.

To restrict the angle-of-view of the display, angle-of-view restriction structures may be used. The angle-of-view restriction structures may include, for example, an angle-of-view restriction layer (sometimes referred to as an angle-of-view restriction film, privacy film, privacy layer, privacy guard, privacy screen, etc.). A privacy film may be formed as a removable film or may be integrated within a display.

Figure 6:
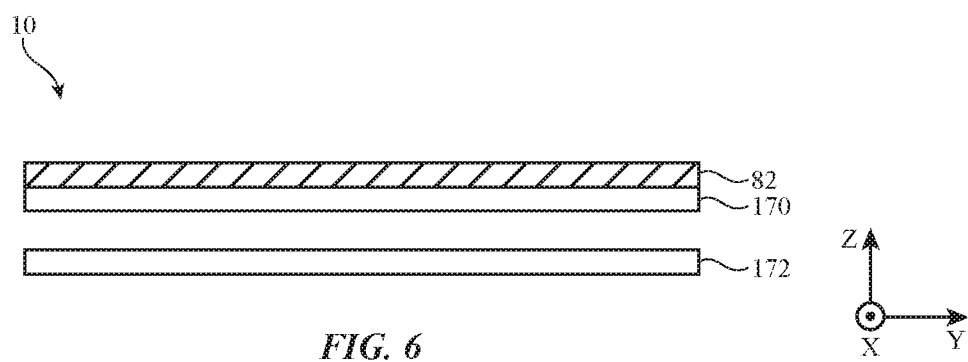
FIG. 6 is a cross-sectional side view of an illustrative removable privacy film that is selectively applied to an electronic device display in accordance with an embodiment.

FIG. 6 shows an illustrative example where privacy film 82 is formed as a removable film. As shown in FIG. 6, display structures 172 (e.g., any of the structures in the liquid crystal display of FIG. 2 or the organic light-emitting diode display of FIG. 3) are formed underneath cover layer 170. If the user of device 10 would like to have increased privacy, privacy film 82 may be placed on top of cover layer 170. Privacy film 82 is formed separately from device 10 (e.g., as a stand-alone product) and can be physically removed from the cover layer if increased privacy is no longer required.

Figure 7:
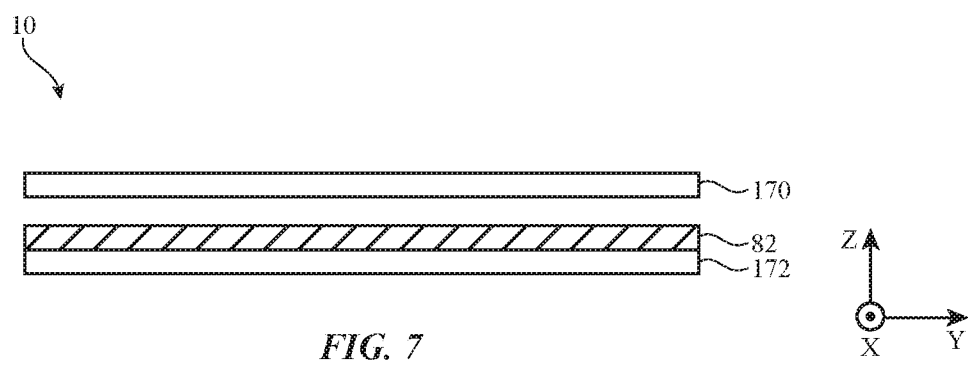
FIG. 7 is a cross-sectional side view of an illustrative privacy film that is integrated with the display of an electronic device in accordance with an embodiment.

Alternatively, privacy film 82 may be integrated within the electronic device. As shown in FIG. 7, privacy film 82 may be formed underneath cover layer 170. The privacy film may be formed over or interposed between layers of display structures 172 at any desired location. Because privacy film 82 is integrated within the electronic device, the privacy film cannot be removed during the course of normal use of the electronic device. Therefore, to allow the user to switch between a normal angle-of-view mode and a reduced angle-of-view mode, privacy film may be switchable so that a desired angle-of-view may be selected. Control circuitry 26, for example, may adjust adjustable components within the privacy film to set a desired angle-of-view.

Figure 8:
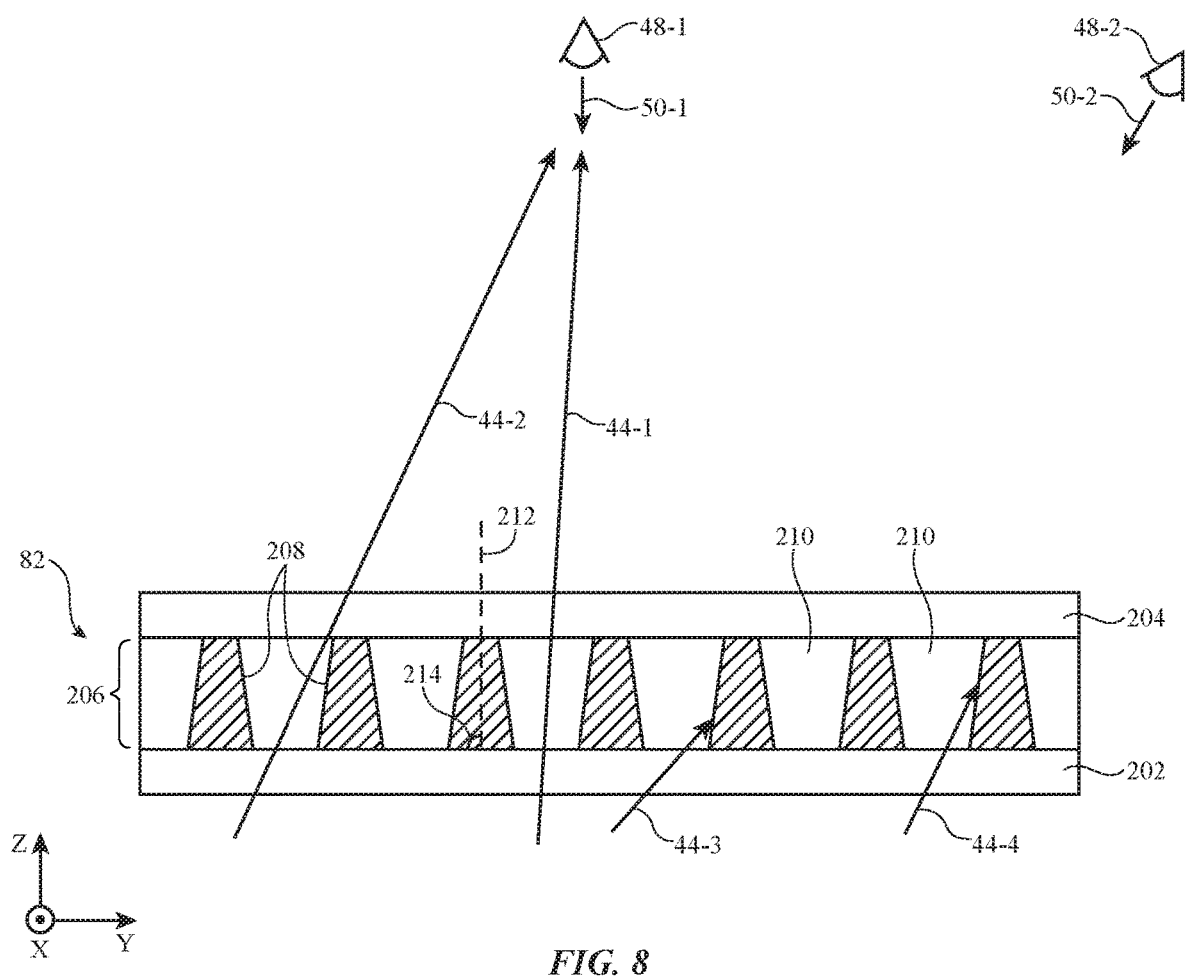
FIG. 8 is a cross-sectional side view of an illustrative privacy film having opaque portions that are perpendicular to an underlying planar display in accordance with an embodiment.

FIG. 8 is a cross-sectional side view of an illustrative privacy film 82. As previously discussed, privacy film 82 may be a removable privacy film that is selectively placed over a display in an electronic device or privacy film 82 may be integrated within a display in an electronic device. As shown in FIG. 8, privacy film 82 includes a selective light-blocking layer 206 interposed between transparent substrates 202 and 204. Transparent substrates 202 and 204 may be formed from any desired material. For example, transparent substrates 202 and 204 may be formed from polyethylene terephthalate (PET), another desired transparent polymer layer, or another desired material. Transparent substrates 202 and 204 may be formed from the same material or may be formed from different materials. One or both of transparent substrates 202 and 204 may optionally be omitted from the privacy film if desired.

Selective light-blocking layer 206 may have a plurality of opaque portions 208 and a plurality of transparent portions 210. Each opaque portion may be interposed between respective transparent portions. The transparent portions 210 may be substantially transparent (e.g., transmitting 90% or more of incident light, transmitting 95% or more of incident light, transmitting 99% or more of incident light, etc.), whereas opaque portions 208 may be substantially opaque (e.g., transmitting 10% or less of incident light, transmitting 5% or less of incident light, transmitting 1% or less of incident light, etc.). The opaque portions may absorb or reflect incident light.

Opaque portions 208 may be shaped to allow light to reach a primary viewer 48-1 that is looking in direction 50-1 at a display underneath the privacy film while blocking light from reaching a secondary viewer 48-2 that is looking in direction 50-2 at the display underneath the privacy film. For example, display light 44-1 may be emitted from the center of the underlying display and display light 44-2 may be emitted from the edge of the underlying display. Both light 44-1 and 44-2 may pass through light-blocking layer 206 and reach primary viewer 48-1. In contrast, display light 44-3 may be emitted from the center of the underlying display towards secondary viewer 48-2 and display light 44-4 may be emitted from the edge of the underlying display towards secondary viewer 48-2. Both light 44-3 and 44-4 are blocked by respective opaque portions 208 in light-blocking layer 206. In this way, privacy film 82 prevents secondary viewer 48-2 from receiving light from the display underneath privacy film 82, thereby ensuring privacy for primary viewer 48-1.

Opaque portions 208 may have any desired shape that allows light to reach the primary viewer while blocking light from reaching the secondary viewer. In the example of FIG. 8, each opaque portion 208 has a trapezoidal cross-sectional shape. This example is merely illustrative, and each opaque portion may have any desired cross-sectional shape (e.g., rectangular, triangular, etc.). Each opaque portion may extend along a respective longitudinal axis 212. Longitudinal axis 212 may pass through the middle of opaque portion 208 (e.g., both the middle of the upper surface of opaque portion 208 and the middle of the lower surface of opaque portion 208). In FIG. 8, each opaque portion may extend along a respective axis 212 that is parallel to the Z-axis. Axis 212 may be at an angle 214 relative to substrate 202. For example, axis 212 may be perpendicular to substrate 202 (and angle 214 is 90°). Substrate 202 is parallel to the underlying display, so axis 212 is also perpendicular to the underlying display. This arrangement helps block light from reaching secondary viewer 48-2 while ensuring light reaches primary viewer 48-1. The axes for all of the opaque portions in light-blocking layer 206 are all parallel to one another in FIG. 8.

Opaque portions 208 and transparent portions 210 of light-blocking layer 206 may be formed from any desired material. For example, opaque portions 208 may be formed from metal, an opaque dielectric material, or any other desired material. Opaque portions 208 may optionally be formed from a material that can be switched between opaque and transparent states (e.g., electrophoretic ink or liquid crystal material). Transparent portions 210 may be formed from a transparent polymer layer or any other desired material. In one illustrative embodiment, transparent portions 210 may be formed from an ultraviolet-light curable resin material. To form the light-blocking layer, the ultraviolet-light curable resin is deposited on substrate 202. A mold may be used to stamp the ultraviolet-light curable resin, forming grooves (recesses) in the ultraviolet-light curable resin. While the stamp is applied to the ultraviolet-light curable resin, the resin may be cured such that grooves are formed. The grooves may then be filled with opaque material to form opaque portions 208. This example is merely illustrative, and light-blocking layer 206 may be formed using any desired methods.

Figure 9:
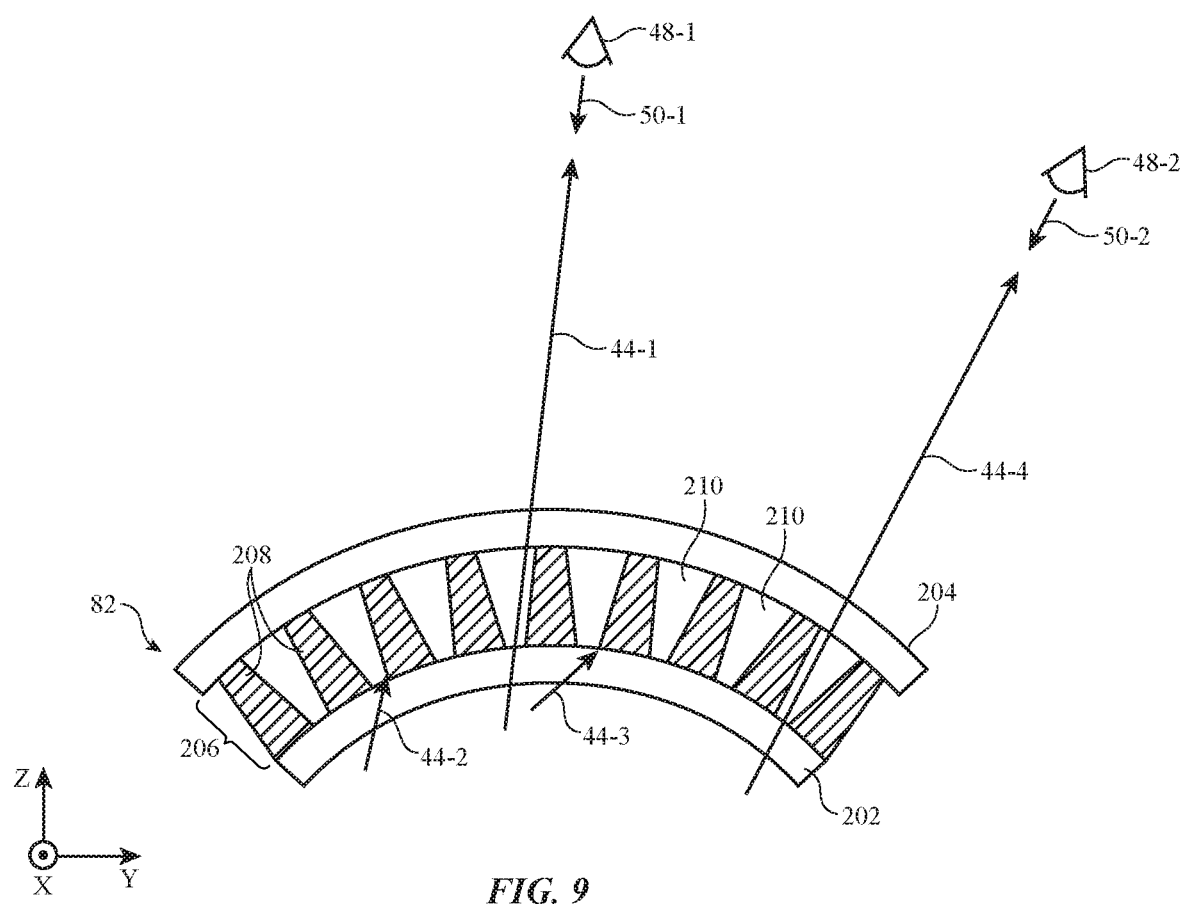
FIG. 9 is a cross-sectional side view of an illustrative privacy film having opaque portions that are perpendicular to an underlying curved display in accordance with an embodiment.

The privacy film of FIG. 8 may increase privacy for a primary user when provided over a planar display. However, if the underlying display has curved portions, the efficacy of the privacy film may be reduced. Consider the example of FIG. 9, in which the same privacy film from FIG. 8 is curved (e.g., and receives light from an underlying curved display). The privacy film may conform to the shape of the underlying display. Display light 44-1 may be emitted from the center of the underlying display and display light 44-2 may be emitted from the edge of the underlying display. Light 44-1 may pass through light-blocking layer 206 and reach primary viewer 48-1, as desired. However, light 44-2 may be blocked by light-blocking layer 206 and may not reach primary viewer 48-1. Display light 44-3 may be emitted from the center of the underlying display towards secondary viewer 48-2 and display light 44-4 may be emitted from the edge of the underlying display towards secondary viewer 48-2. Display light 44-3 may be blocked from reaching secondary viewer 48-2 by an opaque portion in light-blocking layer 206, as desired. However, display light 44-4 passes through the light-blocking layer 206 and reaches secondary viewer 48-2. Therefore, the privacy film 82 of FIGS. 8 and 9 is not as effective when formed over a curved display. The primary viewer 48-1 (who should be able to see the entire display) is undesirably blocked from viewing the edges of the curved display and the secondary viewer 48-2 (who should not be able to see the entire display) can undesirably see the edges of the curved display.

Figure 10:
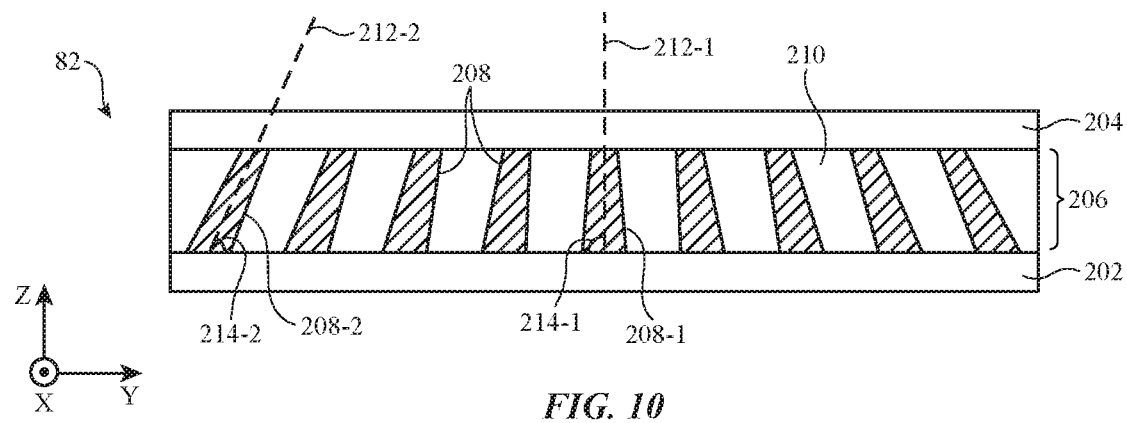
FIG. 10 is a cross-sectional side view of an illustrative privacy film having opaque portions with longitudinal axes of varying angles in accordance with an embodiment.
Figure 11:
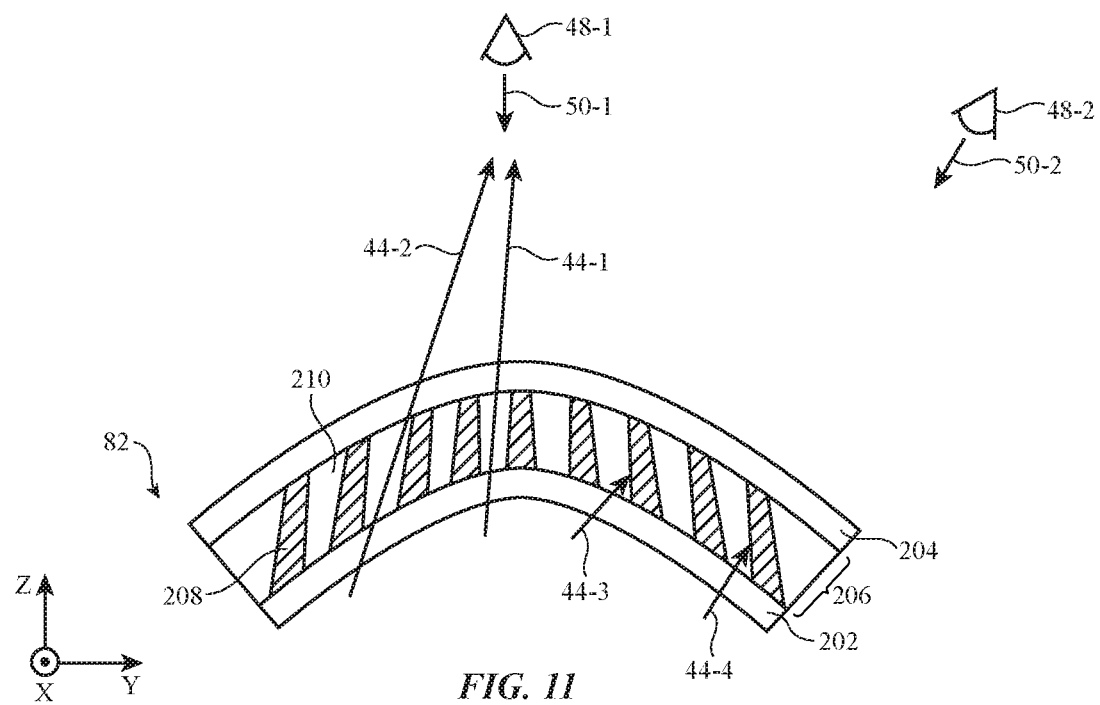
FIG. 11 is a cross-sectional side view of an illustrative privacy film having opaque portions with longitudinal axes of varying angles over a curved display in accordance with an embodiment.

FIGS. 10 and 11 show an illustrative privacy film that may be used in curved displays. As previously discussed, privacy film 82 may be a removable privacy film that is selectively placed over a curved display in an electronic device or privacy film 82 may be integrated within a curved display in an electronic device. As shown in FIG. 10 (in a planar state before the privacy film is applied to the curved display), privacy film 82 includes a selective light-blocking layer 206 interposed between transparent substrates 202 and 204 (similar to as in FIGS. 8 and 9). Transparent substrates 202 and 204 may be formed from any desired material. For example, transparent substrates 202 and 204 may be formed from polyethylene terephthalate (PET), another desired transparent polymer layer, or another desired material. Transparent substrates 202 and 204 may be formed from the same material or may be formed from different materials. One or both of transparent substrates 202 and 204 may optionally be omitted from the privacy film if desired.

Selective light-blocking layer 206 may have a plurality of opaque portions 208 and a plurality of transparent portions 210. Each opaque portion may be interposed between respective transparent portions. The transparent portions 210 may be substantially transparent (e.g., transmitting 90% or more of incident light, transmitting 95% or more of incident light, transmitting 99% or more of incident light, etc.), whereas opaque portions 208 may be substantially opaque (e.g., transmitting 10% or less of incident light, transmitting 5% or less of incident light, transmitting 1% or less of incident light, etc.). The opaque portions may absorb or reflect incident light.

Opaque portions 208 and transparent portions 210 of light-blocking layer 206 may be formed from any desired material. For example, opaque portions 208 may be formed from metal, an opaque dielectric material, or any other desired material. Opaque portions 208 may optionally be formed from a material that can be switched between opaque and transparent states (e.g., electrophoretic ink or liquid crystal material). Transparent portions 210 may be formed from a transparent polymer layer or any other desired material. In one illustrative embodiment, transparent portions 210 may be formed from an ultraviolet-light curable resin material.

To improve performance of the privacy film for curved displays, the shape of the opaque portions 208 may be selected to direct light to the primary viewer while covering the curved display. In particular, as discussed in connection with FIG. 8, each opaque portion may extend along a respective longitudinal axis 212. Each longitudinal axis may be at an angle 214 relative to the underlying substrate 202. For example, longitudinal axis 212-1 may pass through the middle of opaque portion 208-1 (e.g., both the middle of the upper surface of opaque portion 208-1 and the middle of the lower surface of opaque portion 208-1). Longitudinal axis 212-2 may pass through the middle of opaque portion 208-2 (e.g., both the middle of the upper surface of opaque portion 208-2 and the middle of the lower surface of opaque portion 208-2). Opaque portions in the center of the display such as opaque portion 208-1 may extend along a longitudinal axis (e.g., 212-1) that is substantially (e.g., within 3% of) perpendicular to substrate 202. For example, angle 214-1 may be 90°, between 85° and 95°, between 87° and 93°, etc. Opaque portions in the edge of the display such as opaque portion 208-2 may extend along a longitudinal axis (e.g., 212-2) that is at a non-perpendicular angle with respect to substrate 202. For example, angle 214-2 may be less than 85°, less than 75°, less than 45°, between 25° and 85°, between 45° and 88°, between 5° and 70°, etc. The longitudinal axes 212 in FIG. 10 are not all parallel to one another. The longitudinal axes towards the edge of the film may be angled towards the center of the film.

Forming opaque portions 208 at non-perpendicular angles with respect to substrate 202 may improve performance of the privacy film when used to cover a curved display. FIG. 11 shows the privacy film of FIG. 10 in a curved position (e.g., when formed over an underlying curved display). The shape of opaque portions 208 (e.g., extending at non-perpendicular angles relative to the substrate) may allow light to reach a primary viewer 48-1 that is looking in direction 50-1 at a curved display underneath the privacy film while blocking light from reaching a secondary viewer 48-2 that is looking in direction 50-2 at a display underneath the privacy film. For example, display light 44-1 may be emitted from the center of the underlying display and display light 44-2 may be emitted from the edge of the underlying display. Both light 44-1 and 44-2 may pass through light-blocking layer 206 and reach primary viewer 48-1. In contrast, display light 44-3 may be emitted from the center of the underlying display towards secondary viewer 48-2 and display light 44-4 may be emitted from the edge of the underlying display towards secondary viewer 48-2. Both light 44-3 and 44-4 are blocked by respective opaque portions 208 in light-blocking layer 206. In this way, privacy film 82 prevents secondary viewer 48-2 from viewing the display underneath privacy film 82, thereby ensuring privacy for primary viewer 48-1.

As shown in FIGS. 10 and 11, the angle 214 of the longitudinal axis associated with each opaque portion may gradually change from the edge of the privacy film towards the center of the privacy film. The angle may be smallest (e.g., closest to 0°) at the edges of the privacy film and may be closest to 90° at the center of the privacy film. In the edges of the privacy film, each longitudinal axis may be angled towards the center of the privacy film. The angle gradually increases towards 90° as the opaque portions move closer to the center of the privacy film.

Figure 12:
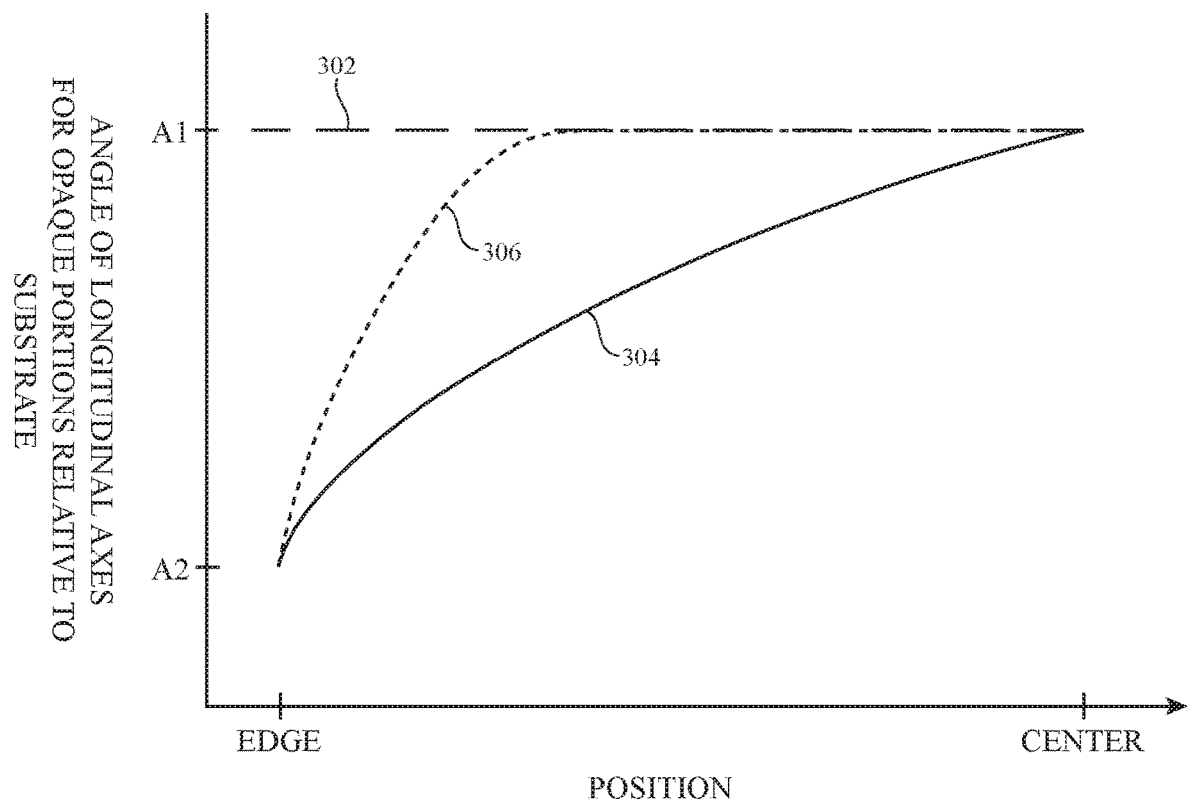
FIG. 12 is a graph showing how the angle of the longitudinal axes for opaque portions relative to the substrate in an illustrative privacy film may vary based on the position of the opaque portion within the privacy film in accordance with an embodiment.

FIG. 12 is an illustrative graph showing how the angle relative to the substrate of the longitudinal axes for opaque portions in the privacy film may vary based on the position of the opaque portion within the privacy film. First, profile 302 shows the longitudinal axes as a function of position for the privacy film shown in FIGS. 8 and 9. As shown, in this embodiment the opaque portions may be uniform and all extend along a longitudinal axis that is at an angle A1 (e.g., 90°) relative to substrate 202. In contrast, profile 304 shows the longitudinal axes angles as a function of position for the privacy film shown in FIGS. 10 and 11. As shown, in this embodiment, the angle of the longitudinal axes increases from angle A2 (e.g., 75° or some other non-90°-angle) at the edges of the privacy film to angle A1 (e.g., 90°) at the center of the privacy film. Profile 304 may have any desired shape (e.g., linear, curved, stepped, etc.). Profile 304 may be suited for a privacy film that covers a display that is entirely curved (as in FIGS. 10 and 11). However, this example is merely illustrative. In some cases, the privacy film may cover a display that has a planar central portion interposed between curved edges. For example, the curved edges may run along first and second edges of the display or the entire periphery of the display (e.g., four edges of the display). In these types of embodiments, profile 306 may be used for the privacy film. In profile 306, the angle starts at angle A2 at the edges of the privacy film and increases to reach angle A1 (e.g., 90°) at the position where the display becomes planar (before the center of the privacy film).

The embodiment of FIGS. 10 and 11 (where the angles of the opaque portions of the light-blocking layer are adjusted based on position within the privacy film) is merely illustrative. If desired, instead or in addition, other layers may be incorporated into the privacy film to provide a reduced viewing angle. Additionally, the shape of the privacy film shown in FIG. 11 (and in any figures herein) is merely illustrative. In general, a privacy film where the angles of the opaque portions of the light-blocking layer are adjusted based on position within the privacy film may be applied to a display of any desired shape (with any desired combination of curved and planar portions).

Figure 13:
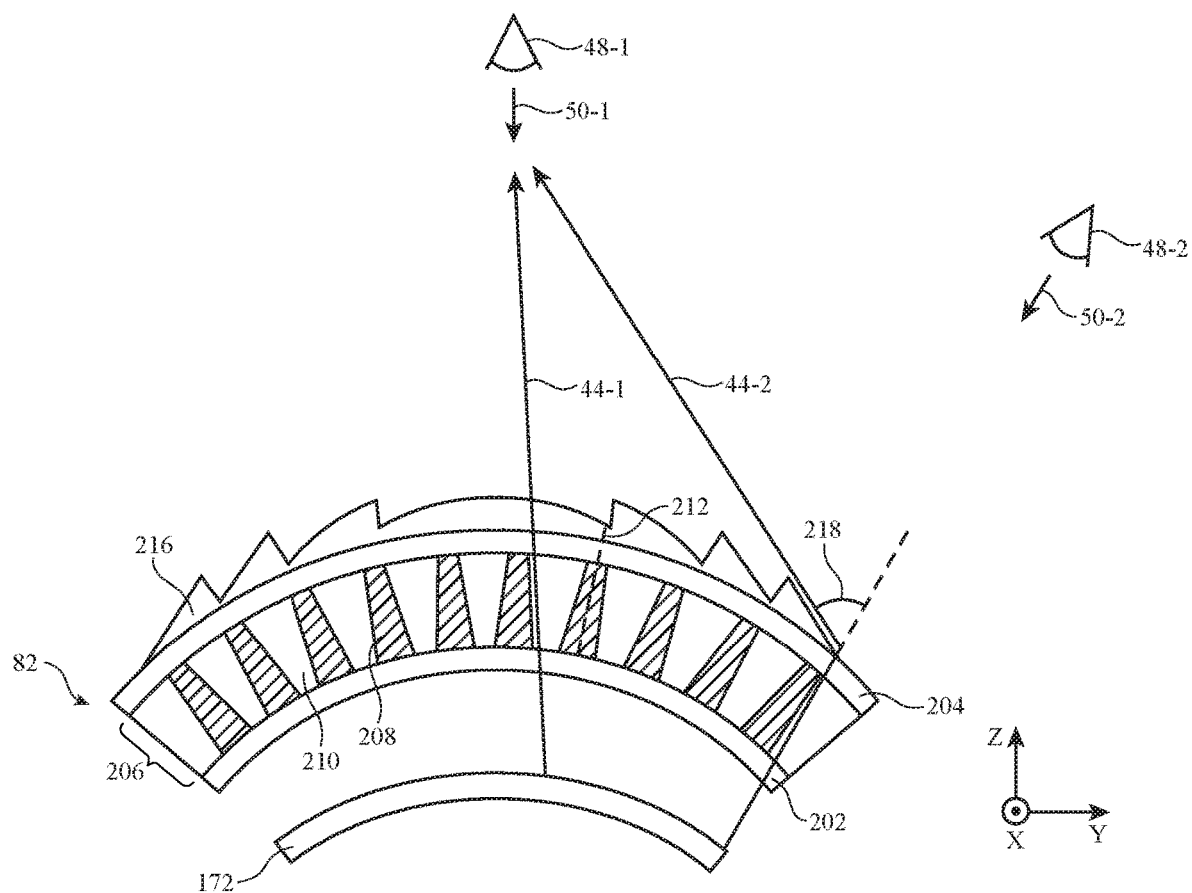
FIG. 13 is a cross-sectional side view of an illustrative privacy film having a prism layer formed over a light-blocking layer in accordance with an embodiment.

FIG. 13 is a cross-sectional side view of an illustrative privacy film having a prism layer that may be used in curved displays. As previously discussed, privacy film 82 may be a removable privacy film that is selectively placed over a display in an electronic device or privacy film 82 may be integrated within a display in an electronic device. As shown in FIG. 13, privacy film 82 includes a selective light-blocking layer 206 interposed between transparent substrates 202 and 204 (similar to as in FIGS. 8 and 9). Transparent substrates 202 and 204 may be formed from any desired material. For example, transparent substrates 202 and 204 may be formed from polyethylene terephthalate (PET), another desired transparent polymer layer, or another desired material. Transparent substrates 202 and 204 may be formed from the same material or may be formed from different materials. One or both of transparent substrates 202 and 204 may optionally be omitted from the privacy film if desired.

Selective light-blocking layer 206 may have a plurality of opaque portions 208 and a plurality of transparent portions 210. Each opaque portion may be interposed between respective transparent portions. The transparent portions 210 may be substantially transparent (e.g., transmitting 90% or more of incident light, transmitting 95% or more of incident light, transmitting 99% or more of incident light, etc.), whereas opaque portions 208 may be substantially opaque (e.g., transmitting 10% or less of incident light, transmitting 5% or less of incident light, transmitting 1% or less of incident light, etc.). The opaque portions may absorb or reflect incident light.

Opaque portions 208 and transparent portions 210 of light-blocking layer 206 may be formed from any desired material. For example, opaque portions 208 may be formed from metal, an opaque dielectric material, or any other desired material. Opaque portions 208 may optionally be formed from a material that can be switched between opaque and transparent states (e.g., electrophoretic ink or liquid crystal material). Transparent portions 210 may be formed from a transparent polymer layer or any other desired material. In one illustrative embodiment, transparent portions 210 may be formed from an ultraviolet-light curable resin material.

In FIG. 13, each opaque portion 208 extends along a respective axis 212 that is substantially perpendicular to transparent substrate 202 (similar to as in FIGS. 8 and 9). A light-redirecting layer such as prism layer 216 is included to allow light to reach a primary viewer 48-1 that is looking in direction 50-1 at a display underneath the privacy film while preventing light from reaching a secondary viewer 48-2 that is looking in direction 50-2. Prism layer 216 may redirect light (e.g., due to refraction when light exits the prism layer) that passes through the prism layer. To direct light at primary viewer 48-1, light such as display light 44-1 that is emitted from the center of display structures 172 may have a low angle of refraction when passing through prism layer 216. This way, light 44-1 passes through the center of the prism layer and reaches primary viewer 48-1. Closer to the edges of the prism layer, however, light may be refracted by a larger angle. For example, display light 44-2 emitted from the edge of display structures 172 may initially be emitted in the direction of secondary viewer 48-2. However, prism layer 216 may refract the light by an angle 218 that causes the light to be redirected towards primary viewer 48-1. Prism layer 216 may be shaped such that for any given point in the privacy film, light from the underlying curved display will be redirected to primary viewer 48-1 (and not reach secondary viewer 48-2). Prism layer 216 therefore reduces the viewing angle of the display (and may sometimes be referred to as an angle-of-view reduction structure).

Prism layer 216 (sometimes referred to as light-redirecting structure 216) may be formed using any desired material. The prism layer may be formed from a material with a high refractive index to ensure sufficient refraction of the light. In FIG. 13, prism layer 216 has a material with a uniform refractive index and varying thickness (shape) that controls redirection of received light. In an alternate embodiment, however, a light-redirecting layer may be included that is formed from a material with a varying refractive index that controls redirection of received light.

Figure 14:
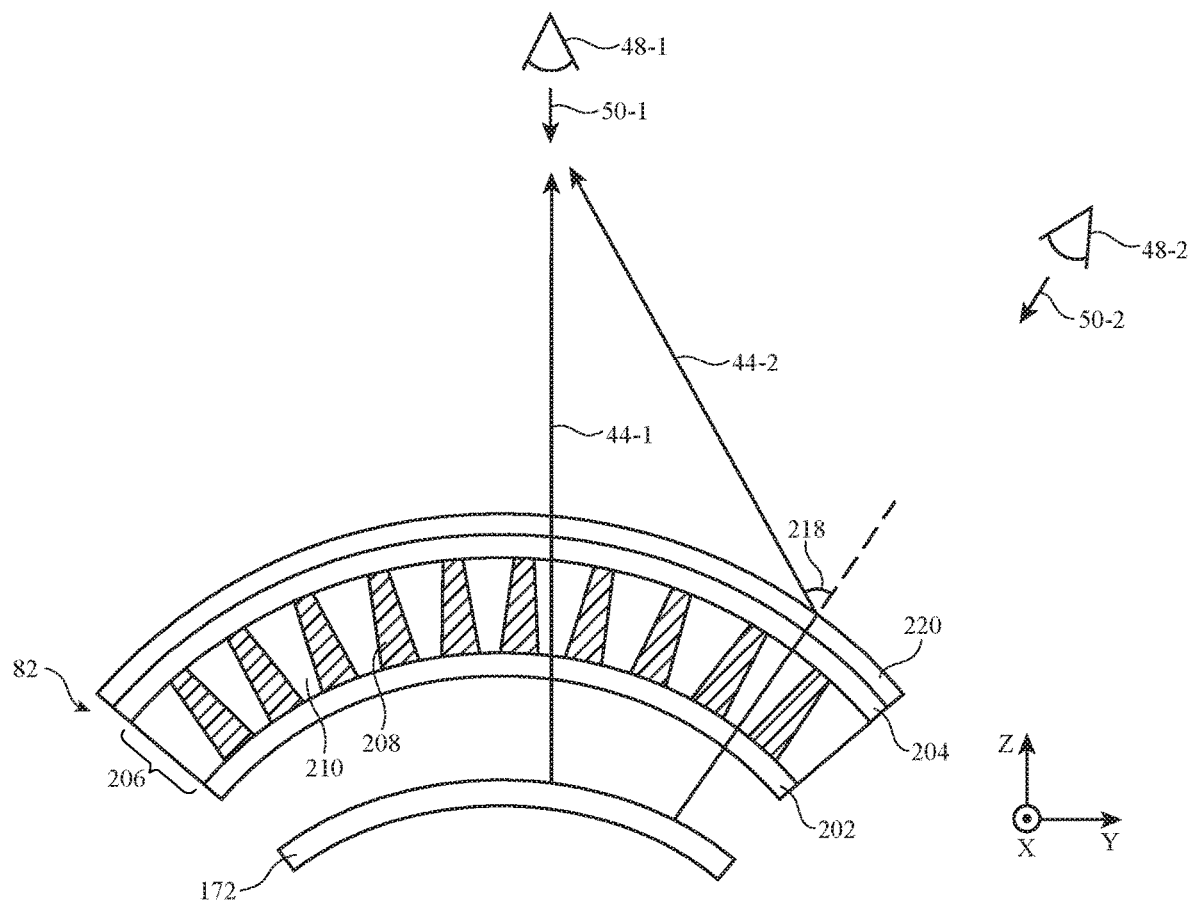
FIG. 14 is a cross-sectional side view of an illustrative privacy film having a light-redirecting layer with a varying refractive index formed over a light-blocking layer in accordance with an embodiment.

FIG. 14 shows an illustrative privacy film with a light-redirecting layer having a uniform thickness and varying refractive index. The privacy film of FIG. 14 is similar to the privacy film of FIG. 13 (with selective light-blocking layer 206 formed from opaque portions 208 and transparent portions 210, transparent substrates 202 and 204, etc.). However, in FIG. 14 a light-redirecting layer 220 is included instead of a prism layer as in FIG. 13. Light-redirecting layer 220 may be a layer of liquid crystal material with a refractive index that varies across the privacy film. The refractive index of each portion of the liquid crystal layer may be changed using the alignment of the liquid crystal material. An electrical signal may also be applied to the liquid crystal layer to control the refractive index of each portion of the liquid crystal layer.

To direct light to primary viewer 48-1, light such as display light 44-1 that is emitted from the center of display structures 172 may have a low angle of refraction when passing through light-redirecting layer 220 (sometimes referred to as liquid crystal layer 220). This way, light 44-1 passes through the center of the light-redirecting layer and reaches primary viewer 48-1. Closer to the edges of the light-redirecting layer, however, light may be refracted by a larger angle. For example, display light 44-2 emitted from the edge of display structures 172 may initially be emitted in the direction of secondary viewer 48-2. However, light-redirecting layer 220 may refract the light by an angle 218 that causes the light to be redirected towards primary viewer 48-1. Light-redirecting layer 220 may have a refractive index profile such that for any given point in the privacy film, light from the underlying curved display will be redirected to primary viewer 48-1 (and not reach secondary viewer 48-2). Light-redirecting layer 220 therefore reduces the viewing angle of the display (and may sometimes be referred to as an angle-of-view reduction structure). Light-redirecting layer 220 may, for example, have a higher index of refraction at the edges of the light-redirecting layer than in the center of the light-redirecting layer.

Figure 15:
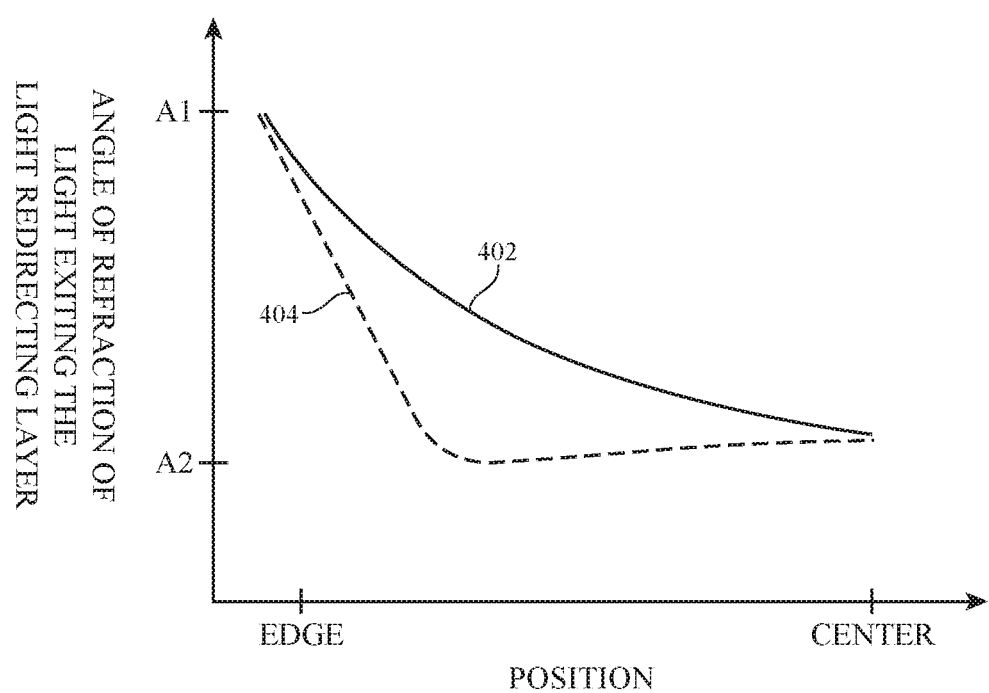
FIG. 15 is a graph showing how the angle of refraction of light exiting an illustrative light-redirecting layer may vary as a function of position within the privacy film in accordance with an embodiment.

FIG. 15 is an illustrative graph showing how the angle of refraction of light exiting the light-redirecting layer (e.g., prism layer 216 in FIG. 13 or liquid crystal layer 220 in FIG. 14) may vary as a function of position within the privacy film. Profile 402 shows angle of refraction as a function of position for the privacy films in FIGS. 13 and 14, for example. As shown, in this embodiment the angle of refraction starts at angle A1 at the edge of the privacy film and gradually decreases to angle A2 at the center of the privacy film. Angle A1 may be any desired angle that redirects light towards the primary viewer of the display (e.g., 15°, 25°, 45°, between 10° and 60°, greater than 5°, greater than 20°, greater than 40°, less than 75°, less than 55°, less than 35°, etc.). Angle A2 may be 0° or approximately 0° (e.g., less than 5°) such that the light emitted from the center of the display is not redirected and continues towards the primary viewer.

Profile 402 may be applicable to a display that is entirely curved (as in FIGS. 13 and 14). However, this example is merely illustrative. In some cases, the privacy film may cover a display that has a planar central portion interposed between curved edges. For example, the curved edges may run along first and second edges of the display or the entire periphery of the display (e.g., four edges of the display). In these types of embodiments, profile 404 may be used for the privacy film. In profile 404, the angle of refraction starts at A1 at the edges of the privacy film and decreases to reach A2 (e.g., 0°) at the position where the display becomes planar (before the center of the privacy film). These profile shapes are merely illustrative. In general, the angle of refraction may vary in any desired manner across the privacy film (e.g., according to a step function). A privacy film with varying angles of refraction may be applied to a display of any desired shape (with any desired combination of curved and planar portions).

Figure 16:
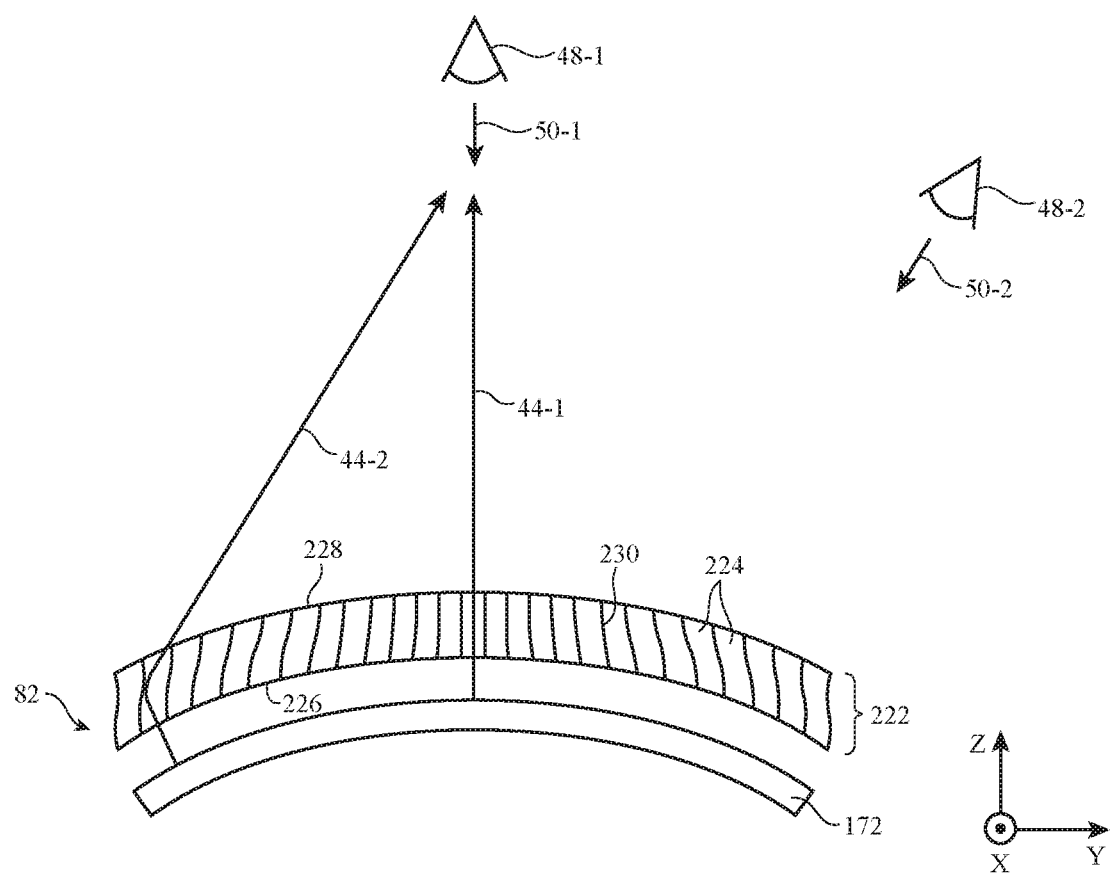
FIG. 16 is a cross-sectional side view of an illustrative privacy film that includes a coherent fiber bundle in accordance with an embodiment.

FIG. 16 is cross-sectional side view of an illustrative privacy film formed from a coherent fiber bundle. As shown, privacy film 82 may include a fiber bundle 222 (sometimes referred to as light-redirecting layer 222) that is formed from a plurality of fibers 224. Each fiber 224 may include fiber cores of a first refractive index surrounded by cladding (e.g., polymer binder) of a second, lower refractive index. The fiber cores may be formed from fibers of glass, polymer, or other transparent material. Core diameters may be, for example, at least 5 microns, at least 7 microns, at least 8 microns, at least 9 microns, less than 40 microns, less than 17 microns, less than 14 microns, less than 11 microns, or other suitable diameter. The fibers may guide light received from display structures 172 from input face 226 to output face 228. The fibers may be shaped to direct light towards primary viewer 48-1 looking in direction 50-1. For example, both light 44-1 emitted from the center of the display and light 44-2 emitted from the edge of the display are directed towards viewer 48-1 by the shape of fiber bundle 222 (and all of the light is directed away from secondary viewer 48-2). If desired, opaque filler material 230 may be incorporated between each fiber in fiber bundle 222. The opaque filler may absorb or reflect light and may be formed from any desired material. This example is merely illustrative, and in some embodiments a transparent filler may be included between fibers of a coherent fiber bundle.

Fiber bundle 222 may sometimes be referred to as an image transport layer. The example of the image transport layer being formed from fibers is merely illustrative. In another possible embodiment, an image transport layer for reducing viewing angle of a display may be formed from Anderson localization material. Anderson localization material is characterized by transversely random refractive index features (higher index regions and lower index regions) of about two wavelengths in lateral size that are configured to exhibit two-dimensional transverse Anderson localization of light. These refractive index variations are longitudinally invariant (e.g., along the direction of light propagation, perpendicular to the surface normal of a layer of Anderson localization material).

Two or more of the features shown in FIGS. 11, 13, 14, and 16 may be included in a single embodiment if desired. For example, the privacy film shown in FIG. 11 may include a light-redirecting layer (as shown in FIG. 13, FIG. 14, or FIG. 16) in addition to having opaque portions with angles that vary based on position within the privacy film. The fiber bundle shown in FIG. 16 may be used as a light-redirecting layer and included over a privacy film having a light-blocking layer if desired. Any of the aforementioned films may be applied to a display of any desired shape (with any desired combination of curved and planar portions).

The foregoing is merely illustrative and various modifications can be made by those skilled in the art without departing from the scope and spirit of the described embodiments. The foregoing embodiments may be implemented individually or in any combination.

What is claimed is:

1. A privacy film configured to cover a display and to reduce a viewing angle of the display, the privacy film comprising:
   a transparent substrate; and
   a light-blocking layer formed on the transparent substrate, wherein the light-blocking layer comprises a plurality of opaque portions and a plurality of transparent portions, wherein a first opaque portion extends along a respective first longitudinal axis at a respective first angle relative to the transparent substrate, wherein a second opaque portion extends along a respective second longitudinal axis at a respective second angle relative to the transparent substrate, and wherein the first and second angles are different.

2. The privacy film defined in claim 1, further comprising:
   an additional transparent substrate, wherein the light-blocking layer is interposed between the transparent substrate and the additional transparent substrate.

3. The privacy film defined in claim 2, wherein the first longitudinal axis extends between the transparent substrate and the additional transparent substrate and wherein the second longitudinal axis extends between the transparent substrate and the additional transparent substrate.

4. The privacy film defined in claim 3, wherein the first opaque portion has a first upper surface adjacent to the additional transparent substrate and a first lower surface adjacent to the transparent substrate, wherein the first longitudinal axis extends between a center of the first lower surface and a center of the first upper surface, wherein the second opaque portion has a second upper surface adjacent to the additional transparent substrate and a second lower surface adjacent to the transparent substrate, and wherein the second longitudinal axis extends between a center of the second lower surface and a center of the second upper surface.

5. The privacy film defined in claim 1, wherein the privacy film has an edge, wherein the first opaque portion is formed a first distance from the edge, wherein the second opaque portion is formed a second distance from the edge that is greater than the first distance, and wherein the second angle is greater than the first angle.

6. The privacy film defined in claim 5, wherein intervening opaque portions between the first opaque portion and the second opaque portion have respective longitudinal axes with respective angles that gradually increase from the first angle to the second angle.

7. The privacy film defined in claim 5, wherein intervening opaque portions between the first opaque portion and the second opaque portion have respective longitudinal axes with respective angles that increase proportionally with a distance from the first opaque portion.

8. The privacy film defined in claim 5, wherein the second opaque portion is formed in a center of the privacy film and wherein the second angle is ninety degrees.

9. The privacy film defined in claim 1, wherein a transparent portion of the light-blocking layer is interposed between each adjacent pair of opaque portions of the light-blocking layer.

10. The privacy film defined in claim 1, wherein the privacy film has an edge and a center, wherein the first opaque portion is formed at the center, wherein the first angle is between 85° and 95°, wherein the second opaque portion is formed at the edge, and wherein the second angle is less than 85°.

11. A privacy film configured to cover a display and to reduce a viewing angle of the display, the privacy film comprising:
    a transparent substrate;
    a light-blocking layer formed on the transparent substrate, wherein the light-blocking layer comprises a plurality of opaque portions and a plurality of transparent portions; and
    a light-redirecting layer, wherein the light-blocking layer is interposed between the transparent substrate and the light-redirecting layer, wherein the light-redirecting layer has a first portion that redirects light at a first angle and a second portion that redirects light at a second angle that is different than the first angle.

12. The privacy film defined in claim 11, wherein the light-redirecting layer comprises a prism layer.

13. The privacy film defined in claim 11, wherein the light-redirecting layer comprises a liquid crystal layer.

14. The privacy film defined in claim 11, wherein the light-redirecting layer comprises a coherent fiber bundle.

15. The privacy film defined in claim 11, wherein the light-redirecting layer is configured to refract light received from the display, wherein the first portion of the light-redirecting layer refracts light at the first angle, wherein the second portion of the light-redirecting layer refracts light at the second angle, and wherein the first angle is less than the second angle.

16. The privacy film defined in claim 15, wherein the first angle is less than 5°, wherein the first portion of the light-redirecting layer is positioned in a center of the privacy film, wherein the second angle is greater than 10°, and wherein the second portion of the light-redirecting layer is positioned at an edge of the privacy film.

17. The privacy film defined in claim 15, wherein an angle of refraction of the light-redirecting layer gradually changes from the first angle to the second angle between the first portion of the light-redirecting layer and the second portion of the light-redirecting layer.

18. A privacy film configured to cover a display with at least one curved portion and to reduce a viewing angle of the display, the privacy film comprising:
 a first transparent layer;
 a second transparent layer; and
 a light-blocking layer having a plurality of opaque portions interposed between the first and second transparent layers, wherein each opaque portion extends along a respective longitudinal axis that extends between the first and second transparent layers at a respective angle relative to the first transparent layer, and wherein the angles of the longitudinal axes gradually change from a first angle for a first opaque portion at a first position to a second angle for a second opaque portion at a second position that is different than the first position.

19. The privacy film defined in claim 18, wherein the privacy film has an edge, wherein the first opaque portion at the first position is a first distance from the edge, wherein the second opaque portion at the second position is a second distance from the edge, and wherein the first distance is different than the second distance.

20. The privacy film defined in claim 19, wherein the first distance is less than the second distance and wherein the first angle is less than the second angle.

21. The privacy film defined in claim 18, wherein the first opaque portion at the first position is configured to overlap the curved portion of the display.

\* \* \* \* \*